United States Patent
Takada et al.

[19]

[11] Patent Number: 6,110,772
[45] Date of Patent: Aug. 29, 2000

[54] SEMICONDUCTOR INTEGRATED CIRCUIT AND MANUFACTURING METHOD THEREOF

[75] Inventors: Tadayoshi Takada, Fukaya; Tsuyoshi Takahashi, Oura-gun; Yasunari Tagami, Oura-gun; Hirotsugu Hata, Oura-gun; Satoru Kaneko, Kumagaya, all of Japan

[73] Assignee: Sanyo Electric Co., Ltd., Moriguichi, Japan

[21] Appl. No.: 09/016,512

[22] Filed: Jan. 30, 1998

[30] Foreign Application Priority Data

| Jan. 31, 1997 | [JP] | Japan | 9-019140 |
| Feb. 21, 1997 | [JP] | Japan | 9-038147 |
| Feb. 28, 1997 | [JP] | Japan | 9-046767 |
| Jan. 14, 1998 | [JP] | Japan | 10-005772 |

[51] Int. Cl.$^7$ .................................................. H01L 21/70
[52] U.S. Cl. ...................... 438/238; 438/239; 438/250; 438/253; 438/329; 438/330; 438/382; 393/396; 393/486
[58] Field of Search .................... 438/149, 166, 438/210, 238, 239, 381, 382, 384, 393, 250, 253, 329, 330, 396, 486; 257/533, 350, 379, 380, 536

[56] References Cited

U.S. PATENT DOCUMENTS

| 4,753,709 | 6/1988 | Welch et al. . | |
| 4,762,801 | 8/1988 | Kapoor | 438/385 |
| 4,812,417 | 3/1989 | Hirao | 437/31 |
| 5,109,262 | 4/1992 | Kadota et al. . | |
| 5,324,983 | 6/1994 | Onai et al. . | |
| 5,350,948 | 9/1994 | Maehara . | |
| 5,420,053 | 5/1995 | Miyazaki | 438/393 |
| 5,479,047 | 12/1995 | Liao et al. . | |
| 5,504,018 | 4/1996 | Sato . | |
| 5,622,887 | 4/1997 | Miwa et al. | 438/330 |
| 5,714,415 | 2/1998 | Oruro | 438/486 |
| 5,759,887 | 6/1998 | Ito et al. | 438/238 |
| 5,798,561 | 8/1998 | Sato . | |
| 5,904,508 | 5/1999 | Codama et al. | 438/151 |
| 5,955,775 | 9/1999 | Miwa . | |

FOREIGN PATENT DOCUMENTS

| 62-163358 | 7/1987 | Japan . |
| 7-235547 | 9/1995 | Japan . |
| 2576373 | 11/1996 | Japan . |

*Primary Examiner*—Mary Wilczewski
*Assistant Examiner*—Yung A. Lin
*Attorney, Agent, or Firm*—Cantor Colburn LLP

[57] ABSTRACT

A semiconductor IC including a resistance element on a circuit substrate. The resistance element includes a resistance layer formed on an insulating layer. The resistance layer is formed using a Si layer obtained by forming an a-Si layer, doping the a-Si layer with impurities, and heating the doped a-Si layer to diffuse the impurities while substantially preserving the fineness of the a-Si layer surface. Preferably, a SiN layer is provided lying beneath the resistance layer. A capacitor may be integrated on the same circuit substrate where the resistance element is formed. In this case, a lower electrode, a SiN dielectric layer, and an upper electrode are formed in this order to constitute a capacitor. The SiN dielectric layer of the capacitor is formed extending from a capacitor formation region to another region, so that the resistance layer of the resistance element is formed on the extending SiN dielectric layer. The lower and upper electrodes of the capacitor may be formed using an a-Si layer, similar to the resistance layer.

7 Claims, 18 Drawing Sheets

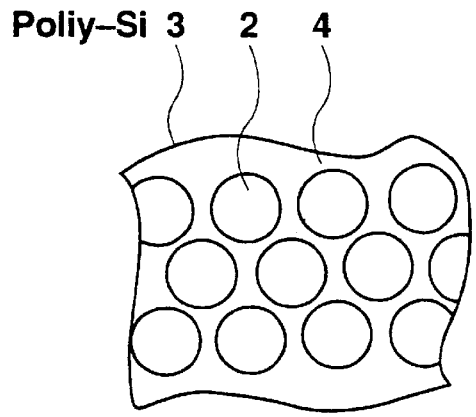
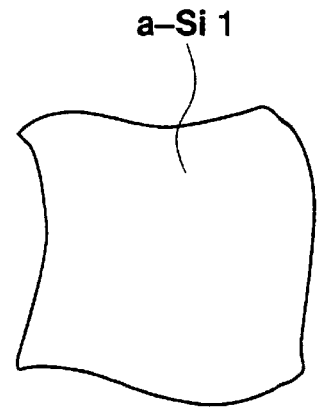
Fig. 2A PRIOR ART     Fig. 2B
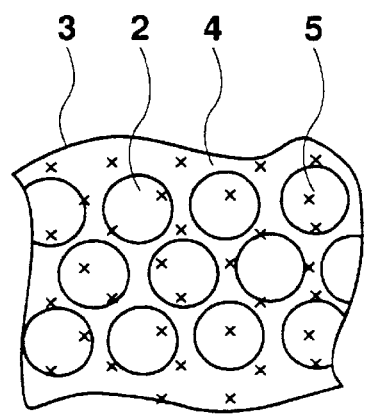
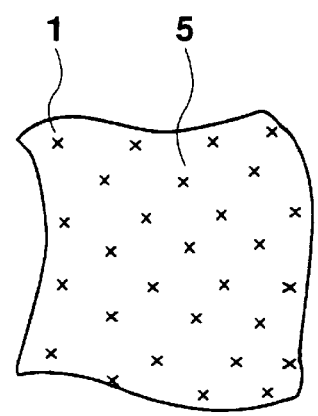
Fig. 3A PRIOR ART     Fig. 3B
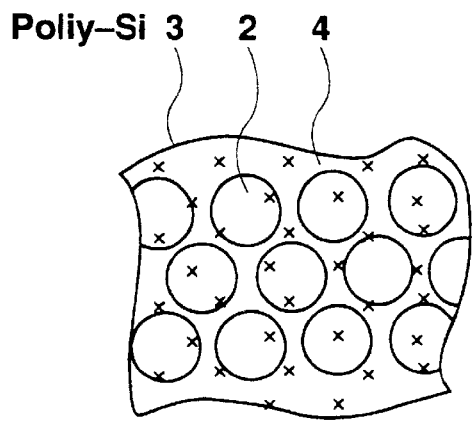
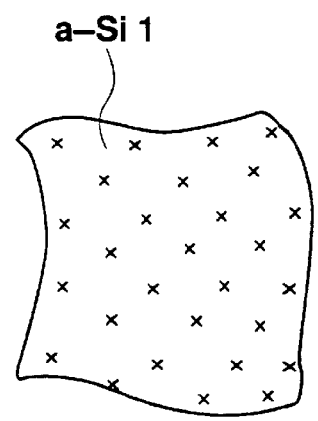
Fig. 4A PRIOR ART     Fig. 4B

SEMICONDUCTOR INTEGRATED CIRCUIT AND MANUFACTURING METHOD THEREOF

BACKGROUND OF THE INVENTION

The present invention relates to a method for manufacturing a semiconductor device with improved characteristics, comprising a silicon resistor, a silicon electrode, and a capacitor including the electrode.

DESCRIPTION OF THE RELATED ART

An integrated circuit (hereinafter referred to as an IC) generally includes a resistor in order to generate voltage for current detection. For such a resistor, a diffusion resistor and a polysilicon (p-Si) resistor are available. A diffusion resistor utilizes a diffusion region, while a p-Si resistor uses polysilicon.

In the recent trend towards highly integrated circuits, p-Si resistors have come to attract wider attention for their advantages mentioned below.

First, a Si resistor does not need to be formed being surrounded by isolated regions, while a diffusion resistor does need to be formed in an island surrounded by isolated regions. Moreover, a p-Si resistor can be situated at any unoccupied areas on an insulating layer, and that is useful in reducing the entire area of an IC.

Second, a circuit including a p-Si resistor is free from the influence of parasitic capacitance as parasitic capacitance is not generated in such a circuit without isolated regions, while a circuit with a diffusion resistor is affected by parasitic capacitance which is generated around a PN joint portion when forming P+ isolated regions.

Because of these advantages, a p-Si resistor is often used in devices. FIG. 1 shows an example structure of a device containing p-Si resistors, in which an N-type epitaxial layer 101 is stacked on a P-type semi-conductor substrate. A P-type diffusion region 102 is formed in the layer 101, and an insulating layer 103 and a p-Si layer 105 are formed in this order on the upper surface of the layer 101. Note that the insulating layer 103 is a $SiO_2$ layer. Further, an interlayer insulating resin layer 106 is formed as a passivation film, and an aluminum electrode 107 is formed on the layer 106.

The above structure in which a diffusion resistor with a positive temperature coefficient is connected in parallel with a p-Si layer with a negative temperature characteristics, constitutes a resistor with a small temperature coefficient.

However, if temperature compensation is not considered, a resistor with a different structure from the above is achievable. That is, a p-Si layer is not situated above a diffusion region, but may be situated at any unoccupied area on, for example, the insulating layer 103, 106, or a LOCOS oxide layer for a MOS or a Bi-CMOS.

Here, it is noted that a p-Si layer 105 is formed by means of low pressure chemical vapor deposition (LPCVD). Specifically, silane gas is deposited onto the upper surface of the insulating layer 103, and heated to a temperature at which the gas is transformed into polysilicon, i.e., approximately 620° C. Observing the surface of the thus structured p-Si film on an electronic microscope shows grains each of a slightly different size. Some are as large as approximately 500 Å in diameter.

In order to form a capacitor on a LOCOS oxide layer or an insulating layer (103 in FIG. 1), a p-Si layer, a SiN layer, and another p-Si layer are formed on the upper surface thereof in this order. These layers respectively serve as a lower electrode, a dielectric layer, and an upper electrode. After formation of these layers Al electrodes, are formed, contacting the upper and lower electrodes.

Although a p-Si resistor is often used in devices because of the advantages thereof as described above, p-Si resistors have problems in that they require more processing steps to produce than a diffusion resistor, and that their characteristics tend to vary.

In detail, in making a p-Si resistor, a plurality of wafers each capable of making a number of ICs, are initially placed on a board and inserted into a film forming chamber of an LPCVD, and suchlike, so that p-Si films are formed on the wafers. As to the thus formed p-Si films, it is known that their characteristics vary widely among those made on different wafers, or even on the same wafer. In other words, characteristics of a p-Si resistor in a IC vary widely, and that resultantly produce many ICs whose resistance values are even beyond tolerable ranges. As a result, the entire IC yield is lowered.

In a capacitor including a p-Si electrode, characteristic variation of a p-Si film will result in variation of capacitor resistance, and further of capacitor characteristics.

Moreover, although a SiN layer in a p-Si electrode is covered by a p-Si layer, as disclosed in JPA (Laid-open No. Sho) 62-163358, and thus seems perfectly protected, in actual fact, weak spots of the SiN layer are easily removed when the SiN layer is etched for thickness control after its formation. For instance, intermediate products of a SiN film can be easily removed by hydrofluoric acid. With weak spots removed, large pin holes are caused on the surface of the SiN layer. Some may be too large to be filled up in a subsequent oxidizing process, and some may be too small to be well oxidized. As a result, more weak spots are made, scattered over the entire film surface. This will induce a short-circuit between the above dielectric member (a p-Si layer here) and the lower electrode below, and degrade film quality.

In the case that the p-Si layer is substituted by a $SiO_2$ layer formed via CVD, the $SiO_2$ layer must be fully removed in making a contact hole as the capacitance of the capacitor would otherwise be deteriorated. Thus, in general, the $SiO_2$ layer must be slightly over-etched for full removal, bringing the SiN layer beneath into exposure to etching gas or liquid. As a result, structurally weak spots of the SiN layer will be etched more, and tolerance and characteristics of the SiN layer will be further deteriorated.

Furthermore, Si—O—N parts around the junction between the Si and SiN layers are partially caused to be transformed into $SiO_2$ or intermediate products of the SiN layer when heated. This also causes more structurally weak spots and pin holes to be caused by etching into the SiN film surface.

SUMMARY OF THE INVENTION

The present invention has been conceived to solve the above problems.

According to the present invention, an a-Si layer is initially formed on an insulating layer; the a-Si layer is doped with impurities; the a-Si layer doped with impurities is heated to diffuse the impurities while substantially preserving the fine surface thereof; and the resultant Si layer is used as a resistor.

The characteristic variation state of a Si film made by heating a doped a Si film (an a-Si originated Si film) and that of a Si film made by heating a doped p-Si film (an p-Si originated Si film) are significantly different from each other.

For instance, variation of sheet resistance among Si layers made by heating doped p-Si layers each of 2000 Å, 3000 Å, 4000 Å thick, at 620° C. may be 3% or more. On the other hand, that among Si layers made by heating doped a-Si layers, each of 2000 Å, 3000 Å, 4000 Å thick, may be only about 1% (see FIG. 6).

Moreover, when those two types of Si films are observed using an electronic microscope, relatively large grains, such as grains of 500 Å in diameter, and grain boundaries are observed on the surface of p-Si originated Si films. Etching such Si films for patterning would result in enhancing unevenness of the surface as grain boundaries are etched more than other parts.

On the other hand, almost no grains and grains boundaries are observed on the surface of an a-Si originated Si film. Thus, etching these Si films would not enhance unevenness of the surface. Rather, a substantially flat surface can be preserved, and characteristic variation of such Si films can be suppressed.

Further, when impurities are implanted into an a-Si film before annealing, the resultant film, or an a-Si originated Si film, has a low sheet resistance (see FIG. 5). Therefore, an a-Si originated Si film is usable for both a resistor and a capacitor electrode, improving their characteristics.

Furthermore, use of a SiN film as a base of an a-Si originated Si film could improve the characteristics of the Si film.

In the case that a MIM- or MIS-type capacitor is formed on the same substrate as that of a resistance element, the dielectric layer of the capacitor, or a SiN layer, is formed so as to serve also as a base of the resistance layer of the resistance element.

Also, characteristic variation of a resistor made of a Si film can be reduced when it is situated on a SiN base. Thus, when a capacitor dielectric layer, which is preferably a thin film being less affected by distortion, is made of a SiN film, and provided laying beneath a resistor of a capacitor, characteristic variation of the capacitor can be reduced.

Further, an a-Si originated Si film having a lower specific resistance than a p-Si originated Si film, can be used for an electrode. Besides, when the thus formed Si electrode is situated on a SiN layer, characteristic variation of the Si electrode can be reduced.

In another aspect of the invention, an a-Si originated Si film acting as a conductor is formed between a dielectric layer and an upper electrode (of a capacitor), and an a-Si originated Si film acting as a resistor is formed to constitute a resistance layer of a resistance element.

When a lower electrode of a capacitor is made of an a-Si originated Si film serving as a conductor, and situated on a SiN layer, the characteristics of the lower electrode are improved.

In still another aspect of the invention, an a-Si originated Si layer acting as a conductor is formed on a dielectric layer of a capacitor to constitute an upper electrode of a capacitor, and an a-Si originated Si layer acting as a resistor is formed to constitute a resistance layer of a resistance element. With this arrangement, it is possible to protect the dielectric layer, using the Si layer, and to reduce characteristic variation of the resistance layer.

In still another aspect of the invention, a SiN layer is formed extending from on the exposed first lower electrode (or a lower electrode formation region) to on a resistance layer formation region. Then, an a-Si originated Si layer acting as a conductor is formed on a part of the SiN serving as a dielectric layer of a capacitor, and an a-Si originated Si layer acting as a resistor is formed on a resistance layer formation region of the SiN layer. With this arrangement, the SiN layer can be used both as a dielectric layer of the capacitor and a base of the resistance layer of the resistance element.

In still another aspect of the invention, a SiN layer is provided beneath the first lower electrode, similar to a SiN layer lying beneath the resistance layer. With this arrangement, the first lower electrode can be given improved characteristics.

As described above, even when a capacitor and a resistance element are situated on the same substrate, their characteristics can be easily improved at the same time. This will contribute to increasing the entire IC yield.

BRIEF DESCRIPTION OF THE DRAWINGS

The above and other objects, features, and advantages, will become further apparent from the following description of the preferred embodiment taken in conjunction with the accompanying drawings wherein:

FIGS. 2A, 3A, 4A are diagrams illustrating transformed states of a Si film processed by a conventional method;

FIGS. 2B, 3B, 4B are diagrams illustrating transformed states of a Si film processed by a method of the present invention;

DESCRIPTION OF THE PREFERRED EMBODIMENTS

In the following, a preferred embodiment of the present invention will be described, referring to the following drawings.

Embodiment 1

Si films were processed in the following experiment to observe the transforming state thereof. The experiment was conducted as follows:

[I]: Forming $SiO_2$ films of 1000 Å thickness on Si substrates.

[II]: Inserting the subjects into an LPCVD reaction chamber and heating them at 540° C., 580° C., 600° C., and 620° C.

Supplying 100% silane gas (SiH4) into the chamber so that Si layers were formed on the $SiO_2$ films.

Note that Si layers are formed by growing so as to have thicknesses of 2000 Å, 3000 Å, and 4000 Å, respectively, for each of the above temperatures.

[III]: Implanting $BF_2$ ions of $3 \times 10^{15}$ concentration onto the entire surface of the Si layers at 60 keV.

[IV]: Annealing the subjects in a nitrogen atmosphere at 900° C. for one hour.

[V]: Measuring sheet resistance RS of the annealed Si films of 2000 Å, 3000 Å, 4000 Å thickness, respectively.

FIGS. 2A, 2B, 3A, 3B, 4A, 4B show the transforming states of Si films. FIGS. 2A, 2B show Si films having been processed at [I], [II]; FIGS. 3A, 3B at [I], [II], [III]; and FIGS. 4A, 4B at [I], [II], [III], [IV].

In the experiment, Si films formed by being heated at [II] at a temperature between 520° C. and 580° C. (a low temperature region) were a-Si films, while Si film formed at 610° C. or over (a high temperature region) were p-Si films. Temperatures between 580° C. and 600° C. were considered a transitional region between a-Si and p-Si.

Transformation of a Si film initially heated in a low temperature region is shown in FIGS. 2B, 3B, 4B, which is film transformation by a method of the present invention. On the other hand, film transformation of a Si film initially heated in a high temperature region is shown in FIGS. 2A, 3A, 4A, which is film transformation by a conventional method.

Figure 1:
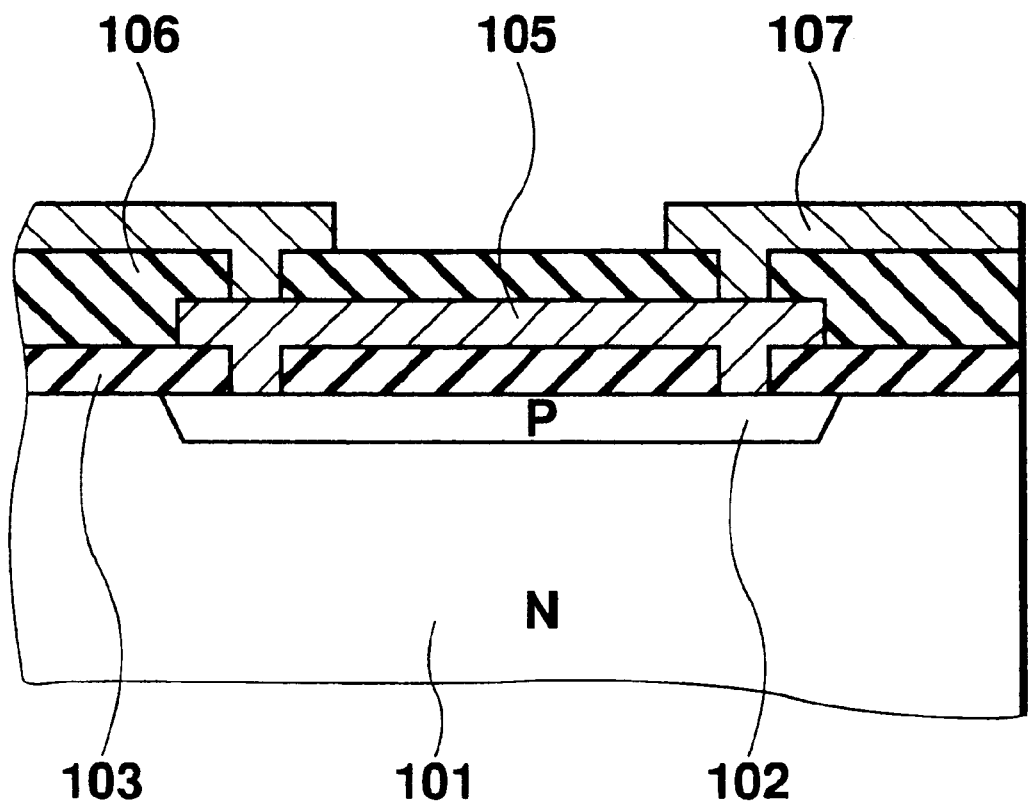
FIG. 1 is a diagram showing a structure of a device using conventional resistors.
Figure 5:
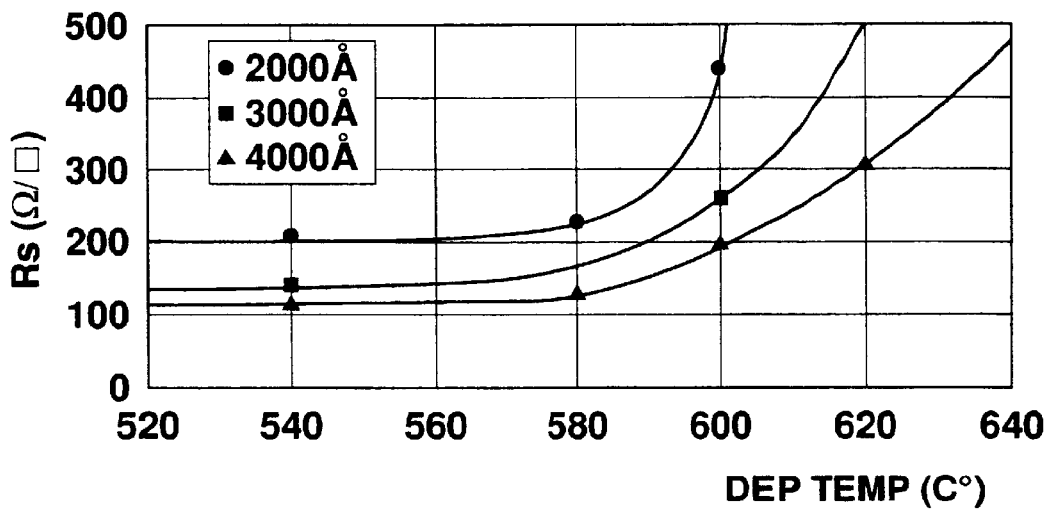
FIG. 5 is a diagram for explaining sheet resistance of resistor films formed using a conventional method or a method of the present invention.
Figure 6:
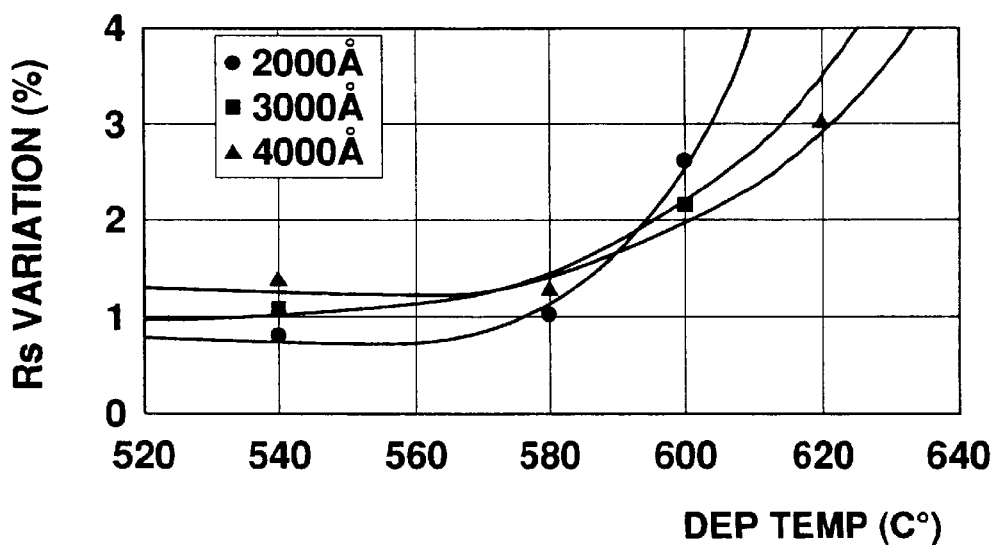
FIG. 6 is a diagram for explaining variation of sheet resistance of the resistor films relative to FIG. 5.

FIGS. 5, 6 are graphs regarding measured sheet resistance RS, in which the horizontal axes represent the temperature at which the reaction chamber was set at [II], or a film formation temperature. FIG. 5 relates to "sheet resistance RS vs. film formation temperature;" FIG. 6 relates to "sheet resistance variation vs. film formation temperature."

According to these drawings, Si films initially heated in a low temperature region has low sheet resistance with small variation.

The surfaces of Si films formed at low and high temperature regions are observed to be quite different on an electronic microscope (×50000). Specifically, a Si film 1 formed in a low temperature region is a-Si, and almost no unevenness is observed on its surface, as shown in FIG. 2B. In contrast, a Si film 3 formed in a high temperature region is p-Si, and relatively large grains 2, some being 500 Å in diameter, were observed, as well as grain boundaries 4 between grains 2, as shown in FIG. 2A.

At [III] where boron fluoride ($BF_2+$) ions were implanted into Si films, it was considered that impurities were dispersed in the same states, as marked by X, in the p-Si film (FIG. 3A) and the a-Si film (FIG. 3B). It should be noted that boron fluoride ions were implanted here, instead of boron ions. This is because boron ions, if implanted, would pass through the a-Si/p-Si layer, while boron fluoride ions, larger than boron ions, will stay close to the film surface and do not pass through the film. As (Arsenic) ions may be alternatively implanted, as they do not pass deep into the film, either.

At [IV] where the Si films are annealed at 800° C. to 1000° C., preferably at 900° C., unexpected results were obtained. That is, although the existence of grains was assured via observation on an electronic microscope (×50000) with respect to the p-Si layer (FIG. 4A), though their diameters had been changed from those in FIG. 3A due to heating, it was not assured with respect to the a-Si layer (FIG. 4B). Considering that an a-Si film can hardly remain intact after being heated, two possible explanations for the unexpected result regarding the a-Si film were available.

(a) the a-Si layer had been transformed into a p-Si layer containing fine grains each being single digit units of Å in diameter; or (b) the a-Si layer had been transformed to contain very large grains, and the observed portion was substantially mono-crystalline.

Further, the fact that no grain boundary was observed may be accounted for by the fact that, in the case of (a), grain boundaries having very small width were finely scattered over the film, or, in the case of (b), grain boundaries do not substantially exist as the Si layer was occupied by only a few very large grains.

To summarize, a Si film formed by being initially heated in a high temperature region and annealed (FIG. 4A) has a rough surface with grains each of approximately 500 Å in diameter, while that which is formed by being initially heated in a low temperature region and annealed (FIG. 4B) has a smoother surface than the former.

Etching such a Si film formed in a high temperature region and annealed will result in enhancing unevenness of the surface as grain boundaries are etched more than other parts. On the other hand, etching a Si film formed in a low temperature region and annealed will not enhance unevenness of the surface which instead remains substantially flat. This may be because, providing that the Si film is in a poly-crystalline state filled with finest grains, such as each of single digit units of Å in diameter, the flat surface of the Si film remains substantially flat even if their grain boundaries are particularly etched. Alternatively, providing that the Si film has only a few large grains, the flat surface of the Si film remains substantially flat despite being etched as almost no grain boundary exists. In either case, a Si film formed in a low temperature region and annealed, is adopted to clear patterning.

In the present invention, an a-Si film is formed on a wafer inside a reaction chamber of an LPCVD apparatus by supplying silane gas in the chamber and heating the wafer in a low temperature region; the obtained a-Si film is doped with impurities and annealed to diffuse the doped impurities; and the annealed resultant Si film is used as a resistor.

The thus formed Si film has a sheet value of small variation and such a smooth surface that can be hardly discriminated from that of an a-Si film, as described above. Thus, the Si film can be easily and accurately etched into a desired pattern without causing a rough surface. A resistor made of such a film resultantly has a resistance value of small variation.

In the following, a semiconductor device including the above mentioned resistor will be described, referring to FIGS. 7 to 14. In these drawings, n-type MOS, an NPN transistor, a capacitor, and a resistance element are formed on the upper surface of a single substrate from its left side to the right side.

Figure 7:
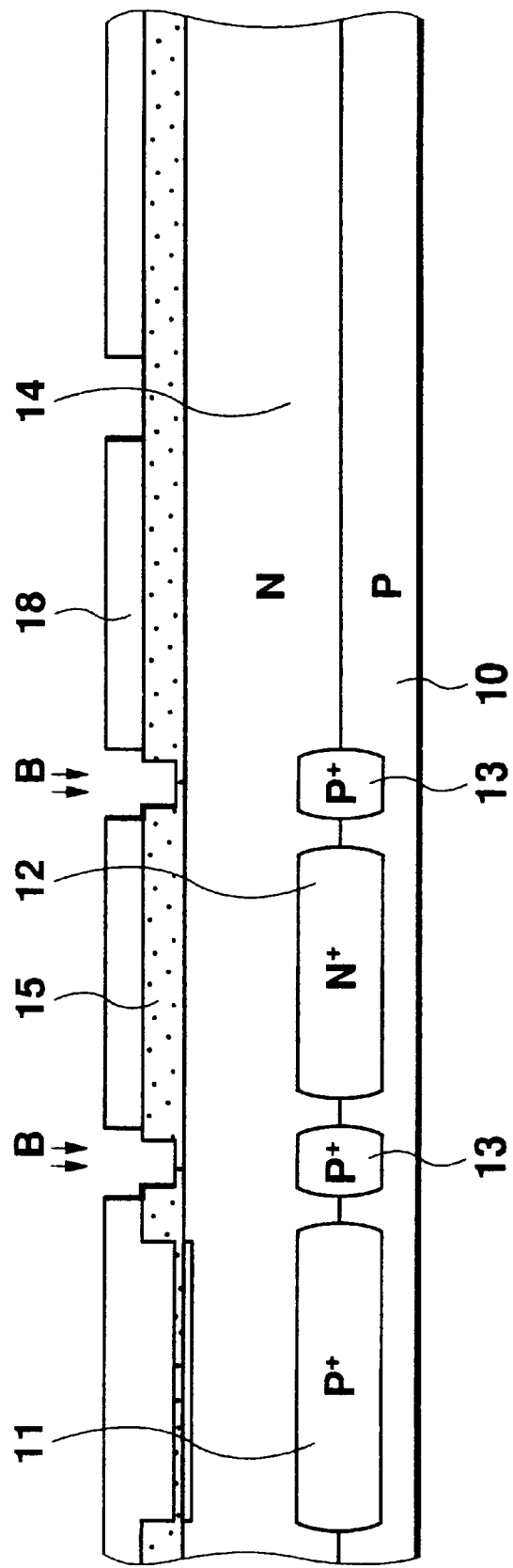
FIGS. 7, 8, 9, 10, 11, 12, 13, 14 are sectional views depicting a method for manufacturing a semiconductor IC according to a first preferred embodiment of the present invention.

Referring to FIG. 7, a P+ semiconductor substrate 10 is doped with predetermined impurities in order to form a P+ buried layer 11, an N+ buried layer 12, and P+ lower isolation regions 13. After doping, an N-type epitaxial layer 14 is formed on the upper surface of the substrate 10. The doped impurities are diffused into the epitaxial layer 14 when the subject is heated to form the epitaxial layer 14 or for some other reason.

The epitaxial layer 14 is then oxidized to thereby form a $SiO_2$ layer 15 thereon which has a thickness of a few thousand Å. The layer 15 has openings at parts corresponding to a P+ type well 16 and an upper isolation region 17 of an N-type MOS to be subsequently formed.

Figure 8:
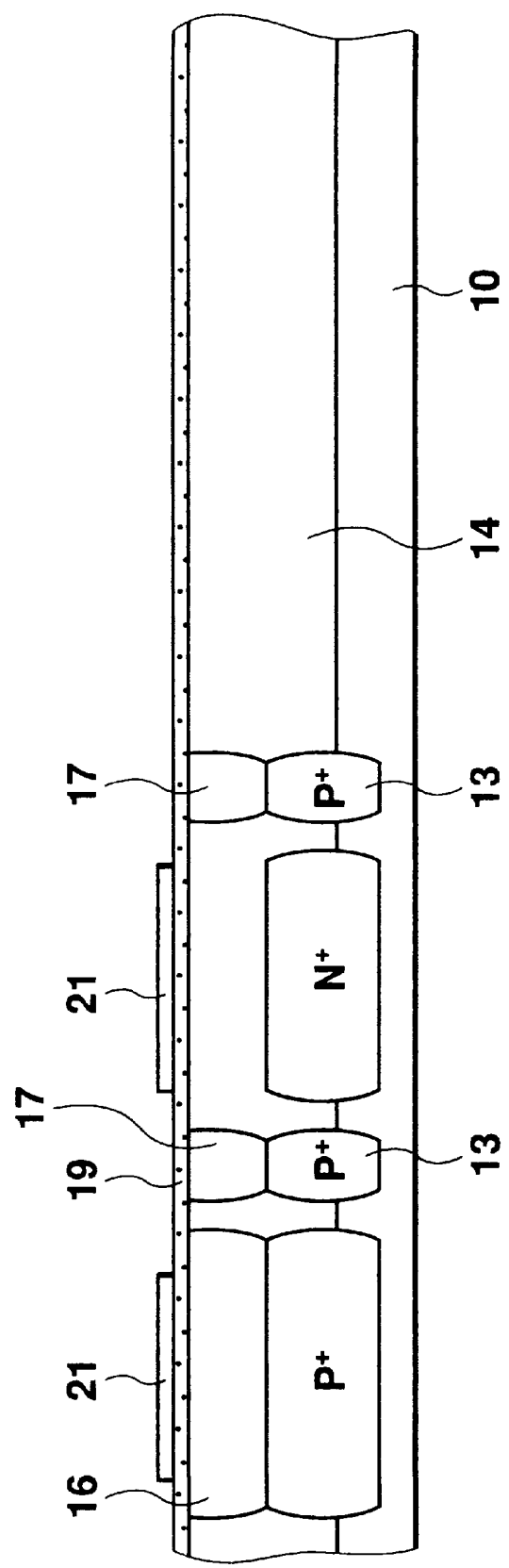

Referring to FIG. 8, boron ions are implanted into the epitaxial layer 14 via the relevant opening, whereby the well 16 is formed. Note that the boron ions have a required concentration to form a well 16. Further, after covering the $SiO_2$ layer 15 with a resist having openings at parts corresponding to the upper isolation region 17, boron ions are implanted into the epitaxial layer 14 via the openings, whereby upper isolated regions 17 are formed. After the lower and upper isolation regions 13, 17 are connected with each other by means of heat diffusion, the SiO$_2$ layer 15 is removed.

Then, an oxide layer 19 of 500 Å thick is formed, covering the entire upper surface of the epitaxial layer 14, and an oxidation resistive layer, or a Si nitride (SiN) layer 21, is formed on the upper surface of the layer 19 except for a part corresponding to a LOCOS oxide layer 20 to be subsequently formed.

Figure 9:
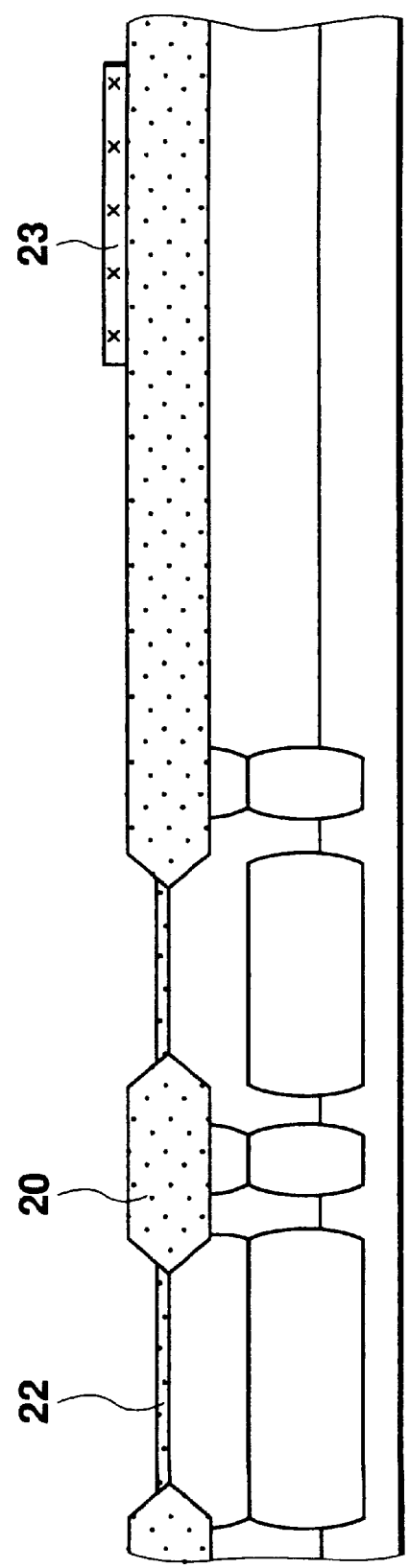

Referring to FIG. 9, an LOCOS oxide film 20 is formed to have a thickness of approximately 7000 Å to 10000 Å on the epitaxial layer 14 by means of LOCOS oxidation processing at approximately 1000° C. Then, after removing the oxide layer 19, a thin oxide film, or a gate insulating film 22, is formed to have a thickness of approximately 500 Å.

At the next stage, a resistor layer, a feature of the present invention, is formed. Specifically, a wafer carrying the layers formed thus far is placed on a wafer board and inserted into a reaction chamber of an LPCVD apparatus, which may be of a low-pressure type, a plasma type, a batch processing type, or a single wafer processing type. In the LPCVD apparatus, a gas (100% silane gas here, but not limited thereto) is ejected in order to form an a-Si layer.

An a-Si layer 23 is formed over the entire surface of the wafer at 520° C. to 580° C., preferably at 540° C. to 560° C. (this temperature being called a layer formation temperature). Then, BF$_2$ ions are implanted into the a-Si layer 23, similar to [III] in the above experiment, and the subject is annealed in a N$_2$ atmosphere at 900° C. The resultant layer is patterned into a desired shape for a resistance layer.

Since the thus formed a Si film (hereinafter referred to as an a-Si originated Si film) has a low sheet resistance and a relatively smooth surface, different from a conventional Si film formed by annealing a doped p-Si film (hereinafter referred to as a p-Si originated Si film), as described above, the Si film is capable of being patterned into a clear shape. A resistor made of such a film has a resistance value with small variation.

Figure 10:
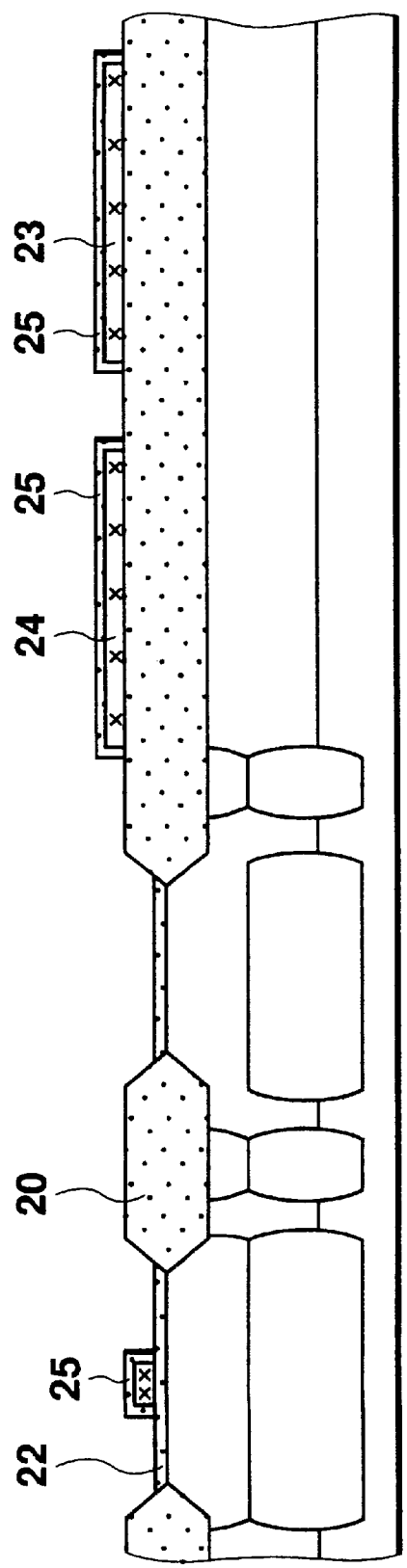

Referring to FIG. 10, the gate insulating layer 22 is made to grow thicker by being subjected to oxidizing processing. Then, a p-Si layer is formed by a LPCVD method, covering the entire upper surface, and doped with impurities, i.e., POCl$_3$, which is subsequently diffused by being heated. The resultant p-Si layer is patterned into a gate, a gate line, and a lower electrode 24 of a capacitor, and further heated to form an oxide layer 25 on the gate.

Figure 11:
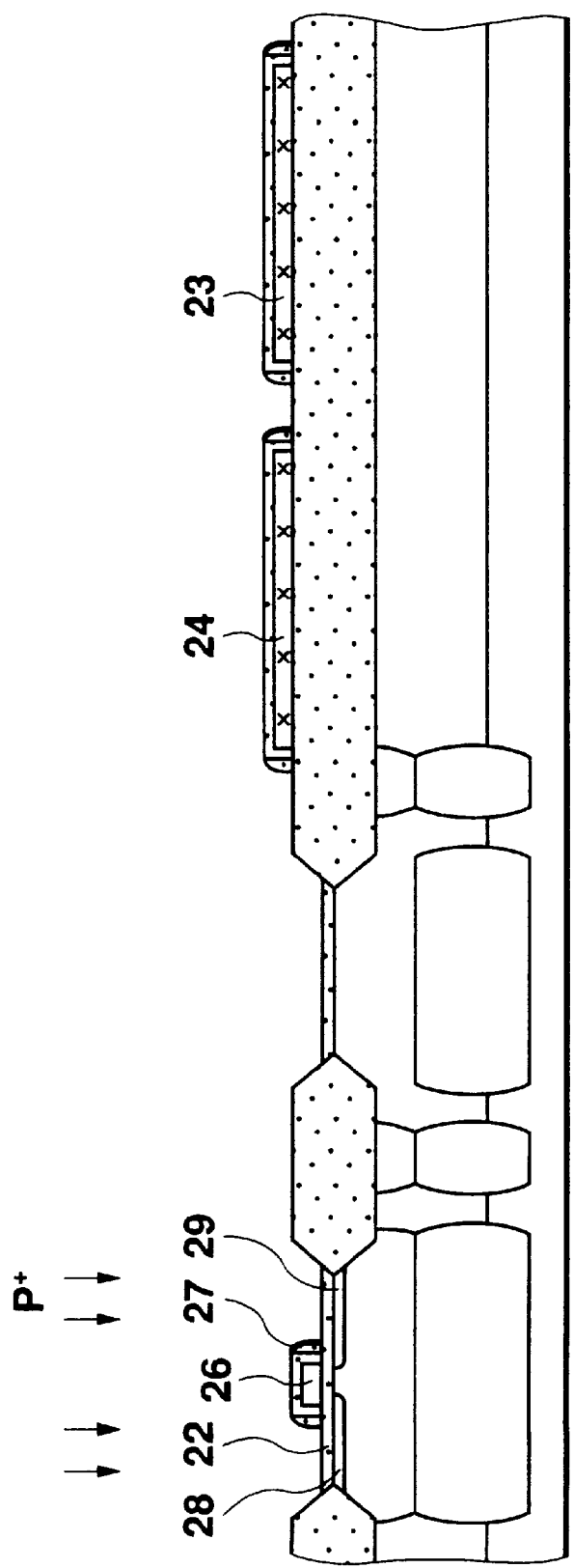

Referring to FIG. 11, a photoresist is formed over the entire surface of the device, which has an opening at an area corresponding to a source-drain formation region. Using the photoresist as a mask, P+ ions are implanted into the source-drain formation region. Further, an oxide layer of 1500 Å thick is formed over the entire surface of the device, and etched to form side walls 27 on both side surfaces of the gate 26. Light doped source 28 and drain 29 have been formed by then by means of heating processing (described later).

Figure 12:
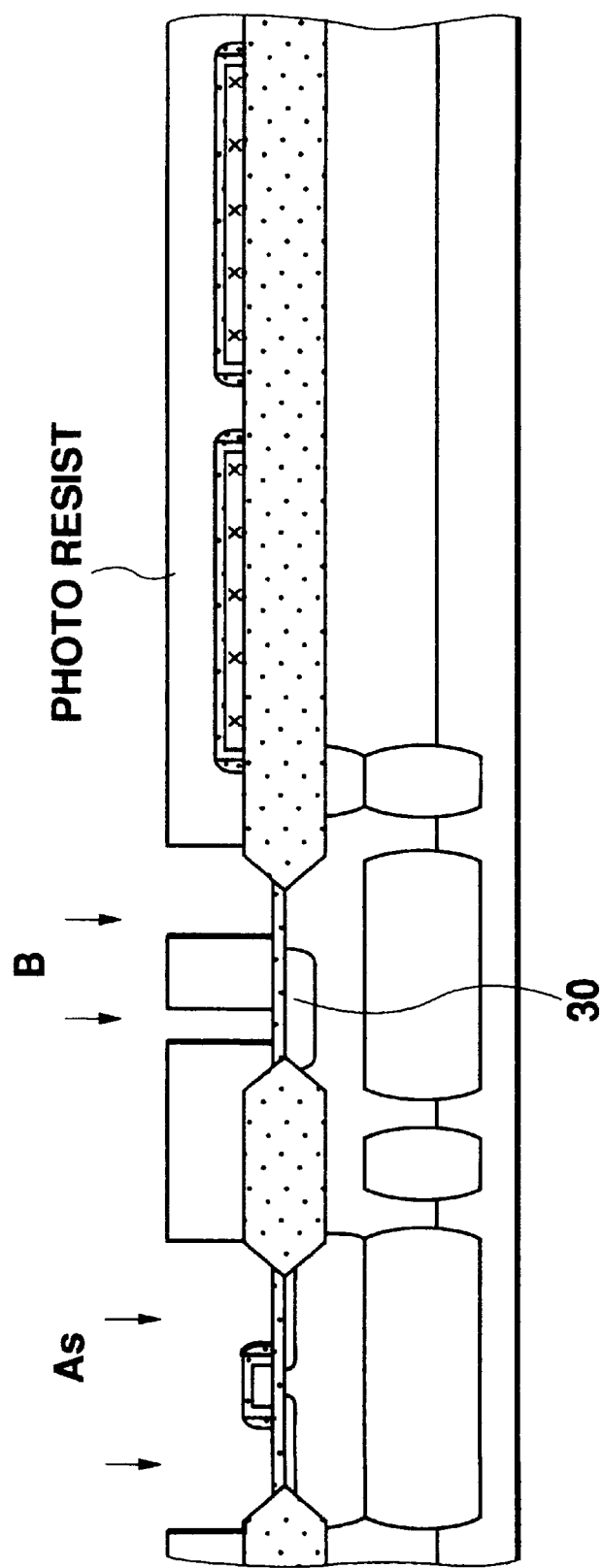

Referring to FIG. 12, another photoresist is formed on the entire surface of the device except for a part corresponding to a base region 30 of an NPN transistor to be later formed. Using the photoresist as a mask, impurities, or boron ions, are implanted into the base region 30. After the photoresist is removed, still another photoresist is formed on the entire surface of the device except for parts corresponding to a source-drain region of an NMOS, and of an emitter and a collector contact of a transistor to be subsequently formed. Using the photoresist and the side walls 27 as a mask, As (Arsenic) ions are implanted into the exposed parts.

Figure 13:
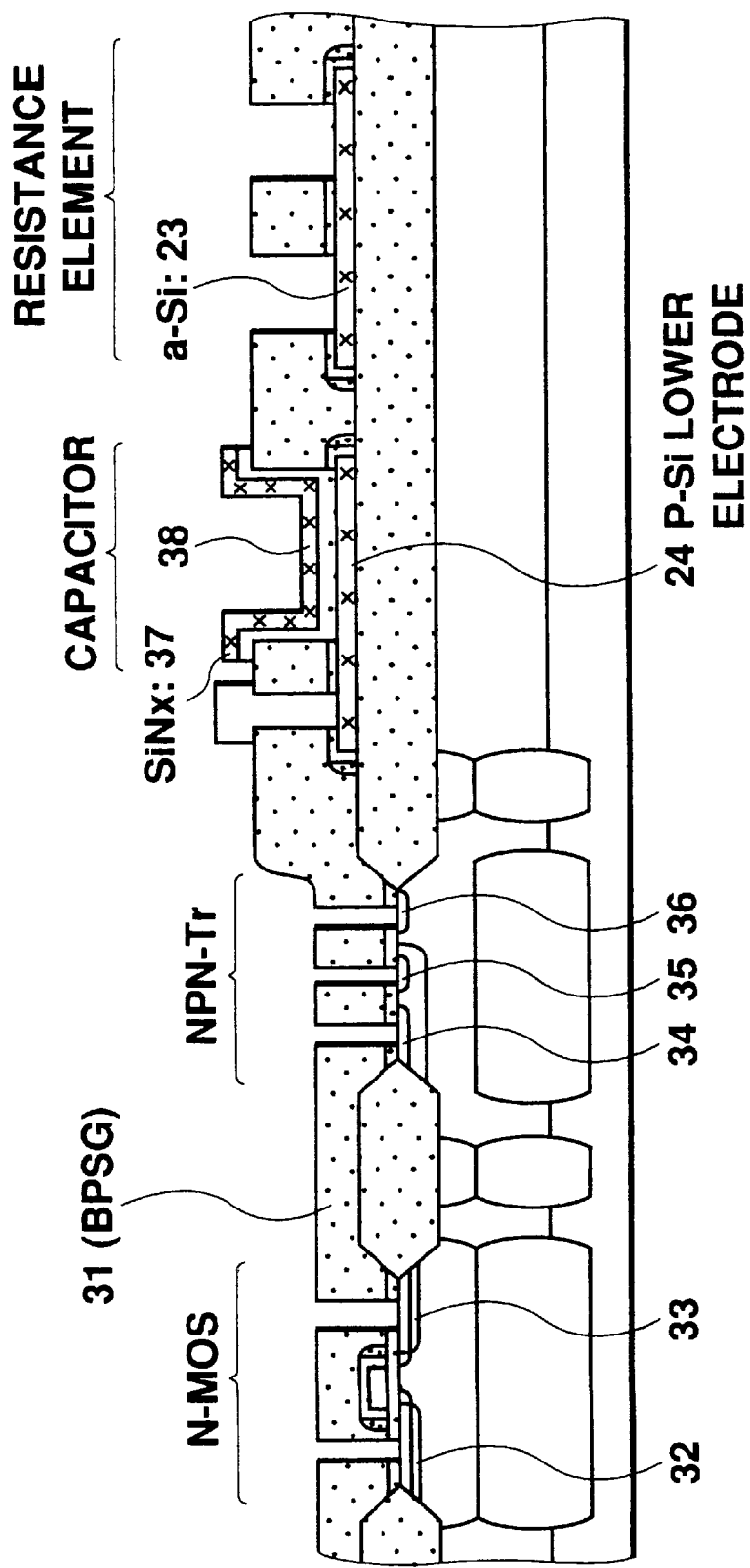

Referring to FIG. 13, after heating the device and removing the photoresist, a BPSG layer 31 is formed on the entire surface of the device. Note that a source region 32, a drain region 33, an emitter region 34, a base contact region 35, and a collector contact region 36, all being heavily doped, have been formed by then by means of heat diffusion.

After the BPSG layer 31 is etched at a part corresponding to a dielectric layer formation region of a capacitor, a SiN layer 37 and a Si layer 38 are formed in this order thereon. The Si layer 38 may be either a p-Si layer or an a-Si layer. Subsequently, a contact hole is made.

Figure 14:
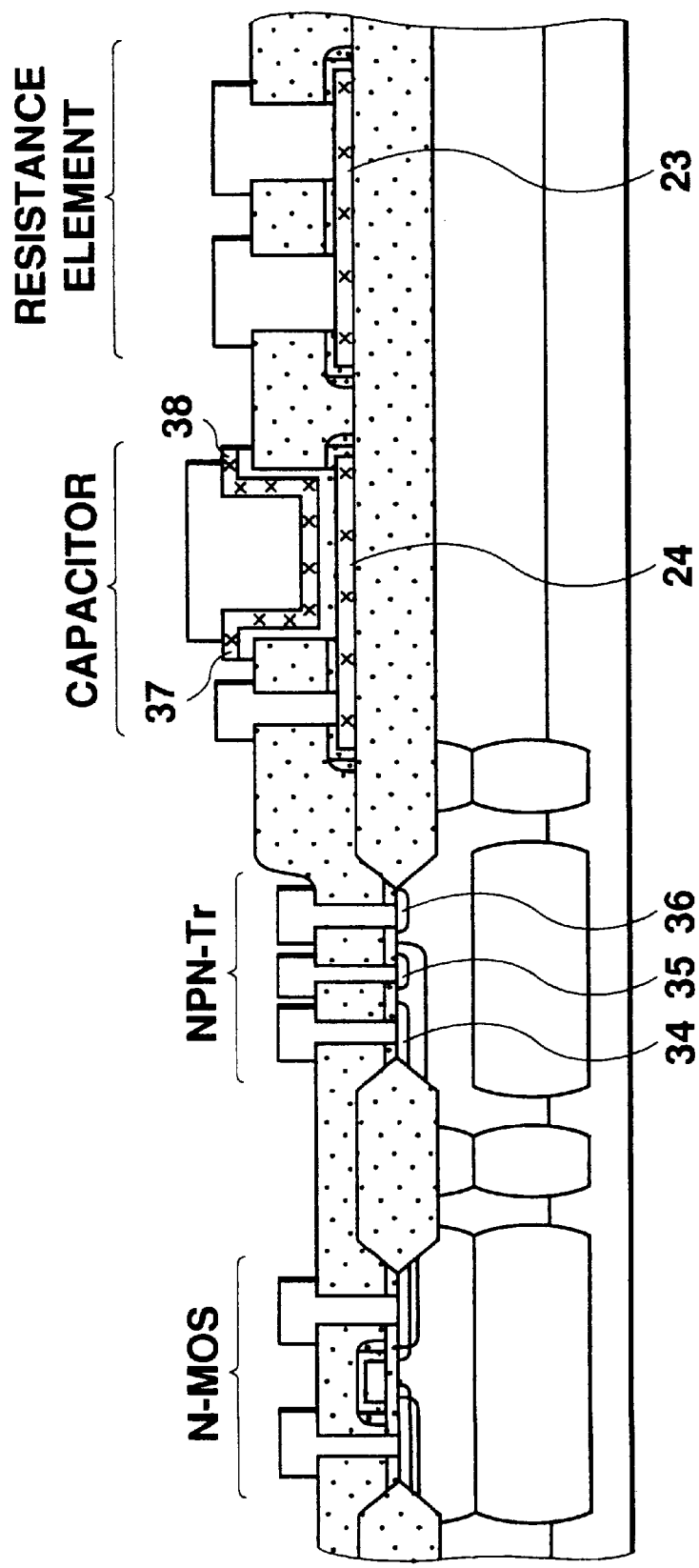

Referring to FIG. 14, an electrode is made on the contact hole. In actual fact, a passivation layer, or the like, is formed covering the entire upper surface of the subject to thereby complete an IC chip, though its explanation is omitted here.

In the following, application of an a-Si originated Si film according to this embodiment to a capacitor, will be described.

As described above, application of an a-Si originated Si film to an electrode would achieve an electrode having a low resistance value of small variation. Specifically, an a-Si film is formed on an insulating layer, and doped with impurities which are then diffused by heating the a-Si layer while substantially maintaining the fine surface of the Si film. The resultant Si layer is used as a lower electrode of a capacitor.

That is, although the resistance value of an a-Si film is already lower than that of a p-Si layer, the resistance value of an electrode made of an a-Si film can be further reduced effectively by doping the a-Si film with impurities when doping the base or the emitter. Moreover, since the surface of an a-Si originated film is in a favorable state, a SiN layer stacked thereon can be given improved characteristics. Still further, due to the improved characteristics of the SiN layer, the quality of a Si layer as an upper electrode superimposed on the SiN layer, whether a p-Si or a-Si originated Si layer, is also improved.

When the dielectric layer of a capacitor is formed of SiN and then covered instantly by an a-Si layer formed as an upper electrode 38 in a non-oxide atmosphere, the SiN layer is protected against exposure to various ambient circumstances. Moreover, since an a-Si originated Si layer can be formed at a lower temperature than a p-Si originated Si layer, such as at approximately 100° C., it is possible to prevent induction of defects or oxidation so as to retain good film quality.

Figure 15:
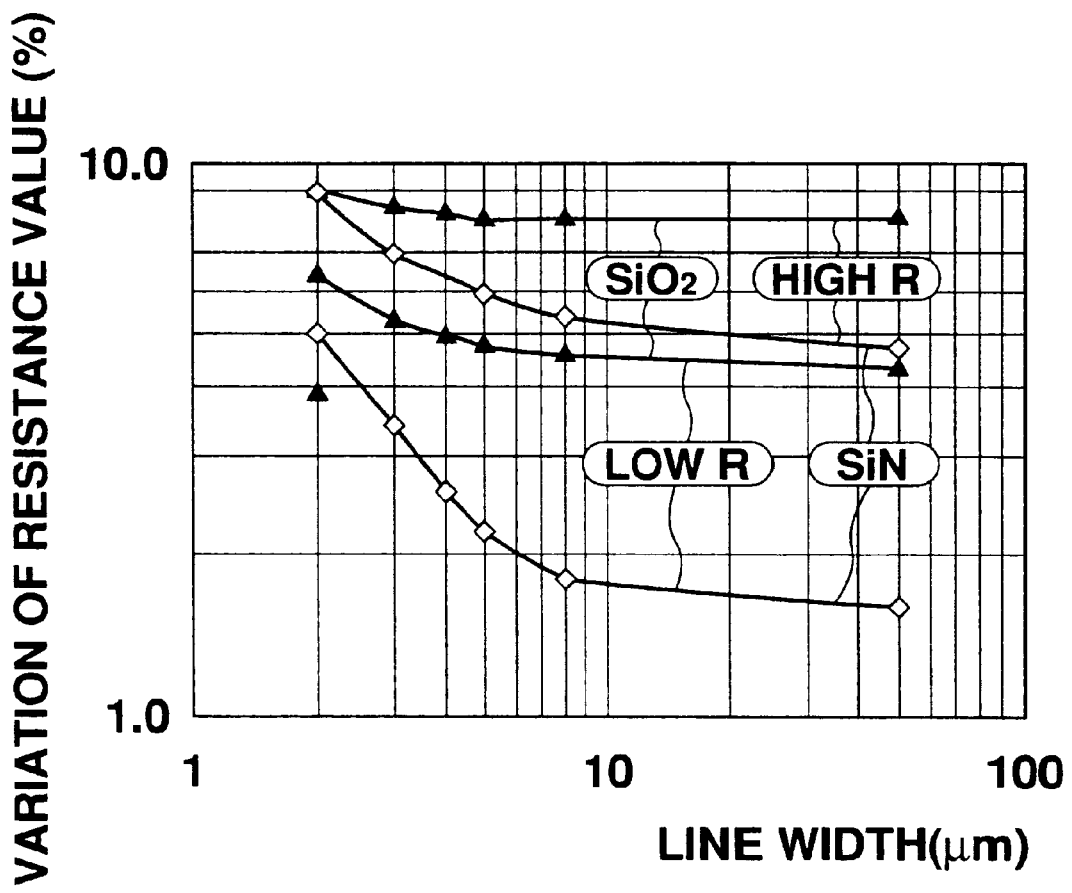
FIG. 15 is a diagram showing variation of resistance values of a Si film supported on either a $SiO_2$ film or a SiN film.

FIG. 15 is a diagram showing variation of a resistance value of an a-Si film supported on either a SiO$_2$ or SiN film. This situation where resistance values of an a-Si film vary, is significantly changed depending on the base layer material. Utilizing this nature, it is possible, for instance, to reduce variation of a resistance value of an a-Si film by situating the a-Si film on a SiN film.

According to FIG. 15, the resistance value of a high resistive a Si film line of 10 μm to 50 μm wide, varies by approximately 5% when it is supported on a SiN substrate, whereas it varies by approximately 8% on a SiO$_2$ substrate. Similarly, the resistance value of a low resistive a Si film line having the same width as the above, varies by approximately 2% when it is supported on a SiN substrate, whereas it varies by approximately 5% on a SiO$_2$ substrate. In view of this, it is assumed that a Si film is favorably supported on a dense and flat SiN film.

This combination, i.e., SiN and a Si, is applicable to a dielectric layer and an upper electrode of a capacitor, achieving a capacitor with superior characteristics.

Embodiment 2

In the following, a semiconductor IC will be described in which a capacitor dielectric layer, or a SiN layer, is also used as a resistor base.

Here, it should be noted that a SiN film constituting a dielectric layer of a capacitor has 400 Å to 500 Å thickness in consideration of achieving improved quality and mass capacitance. Using this SiN film as a resistor base would cause less distortion to the above resistor itself. Note that even a thinner SiN layer may be employed if a SiN film with improved quality is available.

Figure 16:
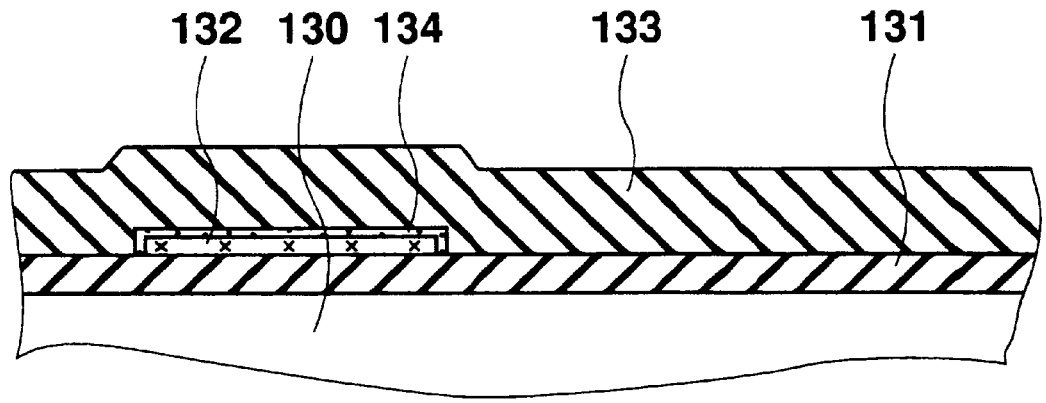
FIGS. 16, 17, 18, 19, 20 are sectional views depicting a method for manufacturing a semiconductor IC according to a second preferred embodiment of the present invention.

Referring to FIG. 16, a first insulating layer 131 is formed on a semiconductor layer 130. In the semiconductor layer 130, a diffusion region is formed where a MOS-type, BIP-type, or Bi-CMOS type element will be subsequently formed. Thus, the first insulating layer 131 may be a LOCOS oxide layer when a MOS will be formed, or a thick oxide layer when a BIP will be formed.

A Si layer is formed as a first lower electrode 132 on the first insulating layer 131, and a second insulating film 133 is formed covering the entire upper surface of the insulating layer 131. An oxide layer 134 may be caused around the Si layer 132 after formation of the first insulating layer 131 during formation of the second insulating layer 133. The oxide layer 134 may be forcibly made by means of oxidation processing.

Figure 17:
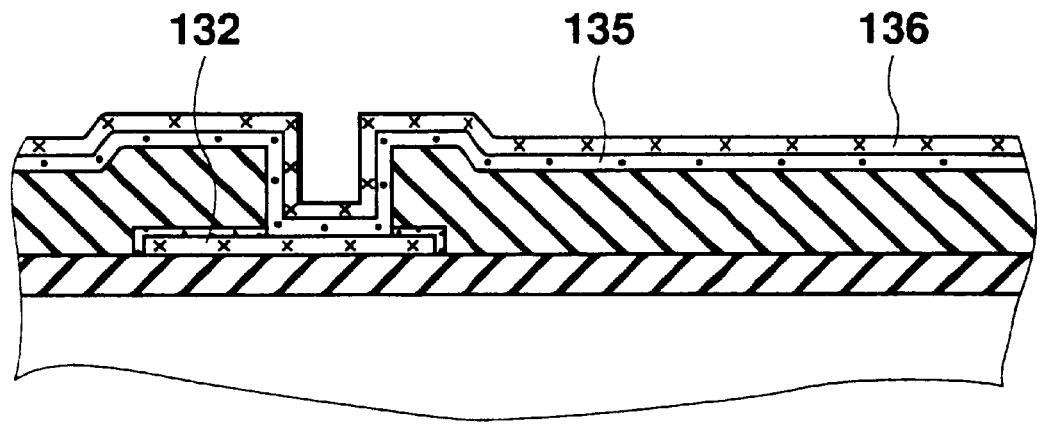

Referring to FIG. 17, the second insulating layer 133 is etched to make an opening at an area where a capacitor dielectric layer is to be formed so that the first lower electrode is exposed. Then, a SiN layer 135 and a Si layer 136 are formed in this order covering the entire upper surface of the subject. The SiN layer will serve as a capacitor dielectric layer. Note that the Si layer 136 may be either a p-Si or a-Si originated film though an a-Si originated layer is superior to a p-Si originated layer, as it has a lower resistance value of smaller variation than the latter, as described above.

Figure 18:
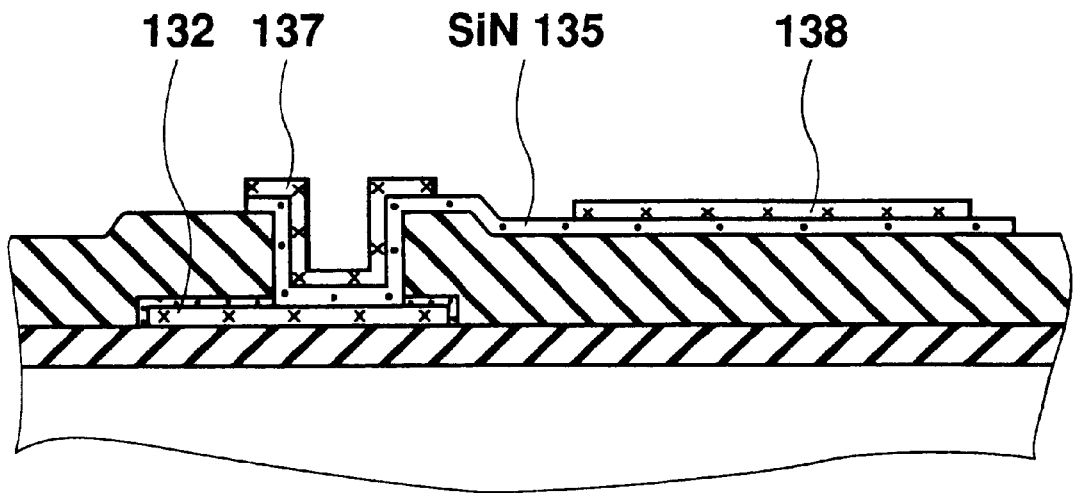

Referring to FIG. 18, the SiN layer 135 and the Si layer 136 are etched into patterns shown in the drawing. The SiN layer 135 may be patterned into one piece covering both a capacitor formation region and a resistance element formation region or two pieces respectively covering these regions, though it is preferably separated when a capacitor will have a film thickness of 1000 Å or more. The patterned Si layer 136 constitutes a first upper electrode 137 on the part corresponding to the opening, and a resistance layer 128 on the part where a resistance element will be formed.

For etching the layers 135, 136, the layer 135 may be etched first as shown in FIG. 17, followed by etching the layer 136 as shown in FIG. 18. Alternatively, the two layers 136, 135 may be etched together into the same pattern.

The processes relative to FIGS. 17 and 18, that is, formation of a SiN layer 135 immediately followed by formation of a Si layer 136 without intervention by etching or oxidation processing, are a feature this embodiment.

With this arrangement, the Si layer 136 protects the SiN layer 135, and also constitutes an electrode. If a Si layer 136 is made of an a-Si originated film, defects will be less induced than a case where it is made of a p-Si originated film, thanks to the lower film formation temperature of an a-Si originated film.

In addition to the above, this embodiment also features use of a capacitor dielectric layer (the SiN layer 135) for a base of the resistance layer 138. That is, by using a SiN layer for a base of a resistance layer 138, it is possible to reduce variation of a resistance value of the resistance layer 138. Moreover, a capacitor dielectric layer and a resistance layer base can be made at the same time.

Figure 19:
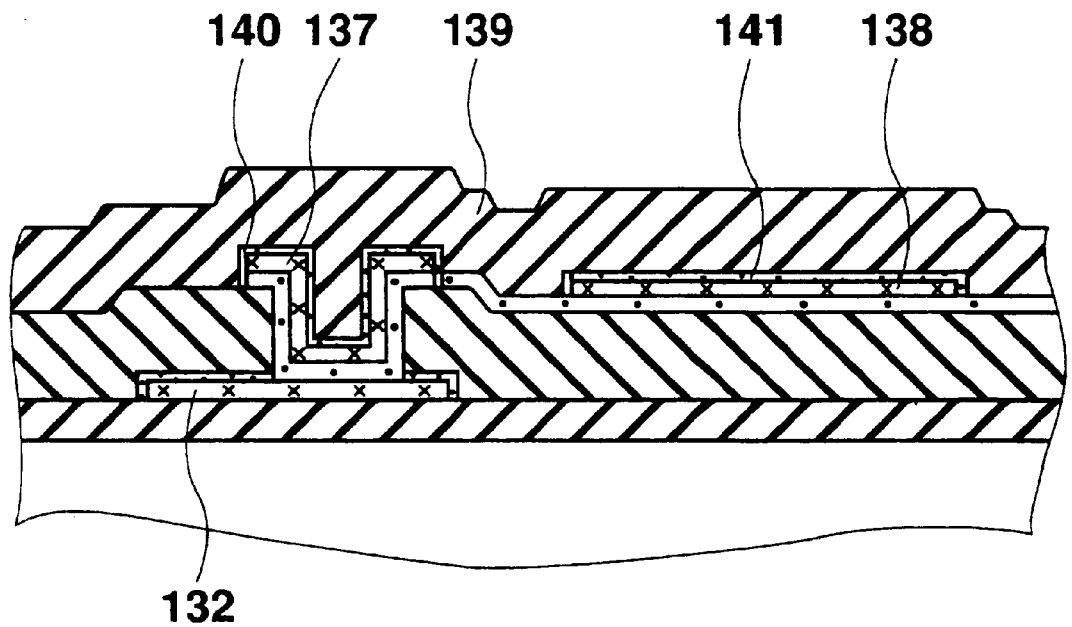

Referring to FIG. 19, a third insulating layer 139 is formed covering the entire surface of the subject. Note that oxide layers 140, 141 are formed on the surfaces of the first upper electrode 137 and the resistance layer 138.

Figure 20:
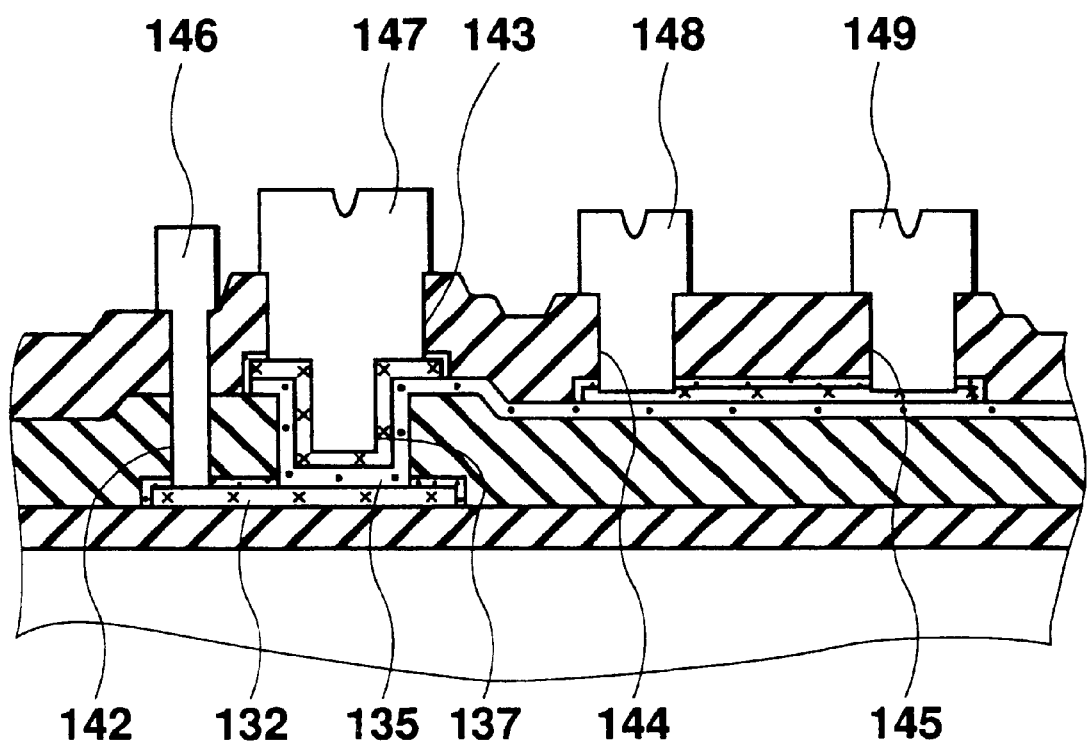

Referring to FIG. 20, a contact hole 142 is made such that the first lower electrode 132 is exposed. Similarly, an opening 143 and contact holes 144, 145 are made such that the first upper electrode 137 and a resistance layer 138 are exposed, respectively. Besides, a second lower electrode 146, a second upper electrode 147, a first resistance element electrode 148, and a second resistance element electrode 149 are also formed.

It should be noted that the first upper electrode 137 has been made to have sufficient thickness so as not to be etched out when making the contact hole 143. That is, since the thickness of insulating layers to be etched to make contact holes 142, 143 are different from each other, the first upper electrode 137 lying at the bottom of the contact hole 143 is subjected to the risk of being etched when the respective insulating layers are etched to form the contact holes 142, 143 at the same time. Should the first upper electrode 137 be completely etched out, the pressure-resistance of the electrode would be deteriorated.

In addition to the above, if a SiN layer is provided spreading below the first lower electrode 132, the first lower electrode 132 is given improved quality, and the SiN layer 135 lying above the electrode 132 is also given improved quality.

Embodiment 3

In the following, a semiconductor IC will be described in which a MIS-type capacitor dielectric layer (or a SiN layer) is used also as a resistor base. Similar to the second embodiment, the SiN layer has a thickness of 400 Å to 500 Å, and used as a base of a resistor.

Figure 21:
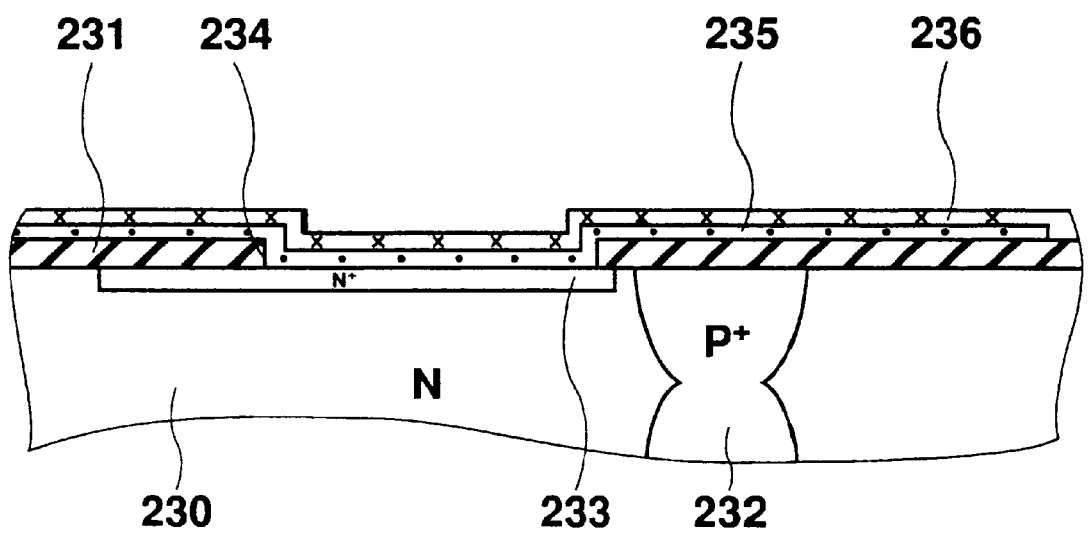
FIGS. 21, 22, 23 are sectional views depicting a method for manufacturing a semiconductor IC according to a third preferred embodiment of the present invention.

Referring to FIG. 21, a first insulating layer 231 is formed on an N-type semiconductor layer 230. In the insulating layer 231, a diffusion region is formed where a BIP-type or Bi-CMOC-type element isolated by a P-type isolation region, will be subsequently formed. Thus, the first insulating layer 231 may be a LOCOS oxide layer when a Bi-CMOS will be formed, or a thick oxide layer when a BIP will be formed.

Below the first insulating layer 231, a lower electrode region 233 of the MIS-type capacitor is formed. The lower electrode region 233 may be of N+type or P+type, the former being depicted in the drawing. The lower electrode region 233 is exposed via an opening 234 of the insulating layer 231. A SiN layer 235 and a Si layer 236 are then formed, covering the entire upper surface of the insulating layer 231 and the opening 234. Note that the Si layer 236 may be either a p-Si or a-Si originated layer, though an a-Si originated layer is superior, as it has a low resistance of small variation, as described above.

Figure 22:
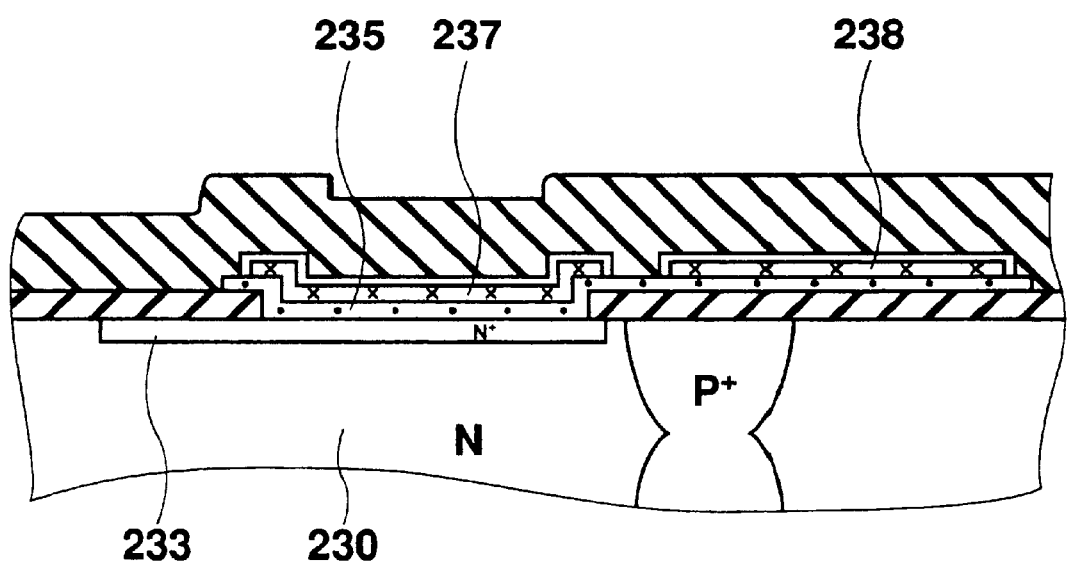

Referring to FIG. 22, the SiN layer 235 and the Si layer 236 are etched into patterns shown in the drawing. The SiN layer 235 may be patterned into one piece covering both a capacitor formation region and a resistance element formation region or two pieces respectively covering these regions, though it is preferably separated when a capacitor will have 1000 Å or more film thickness. The patterned Si layer 236 constitutes a first upper electrode 237 on the part corresponding to the opening 234, and a resistance layer 238 on the part where a resistance element will be formed.

For etching the layers 235, 236, the layer 235 may be etched first into a pattern relative to a capacitor and a resistance element, followed by etching the layer 236 as desired. Alternatively, the two layers 236, 235 may be etched together into the same pattern.

The processes relative to FIGS. 21, 22, that is, formation of a SiN layer 235 immediately followed by formation of a Si layer 236 without intermediate etching or oxidation processing, are a feature of this embodiment.

Figure 23:
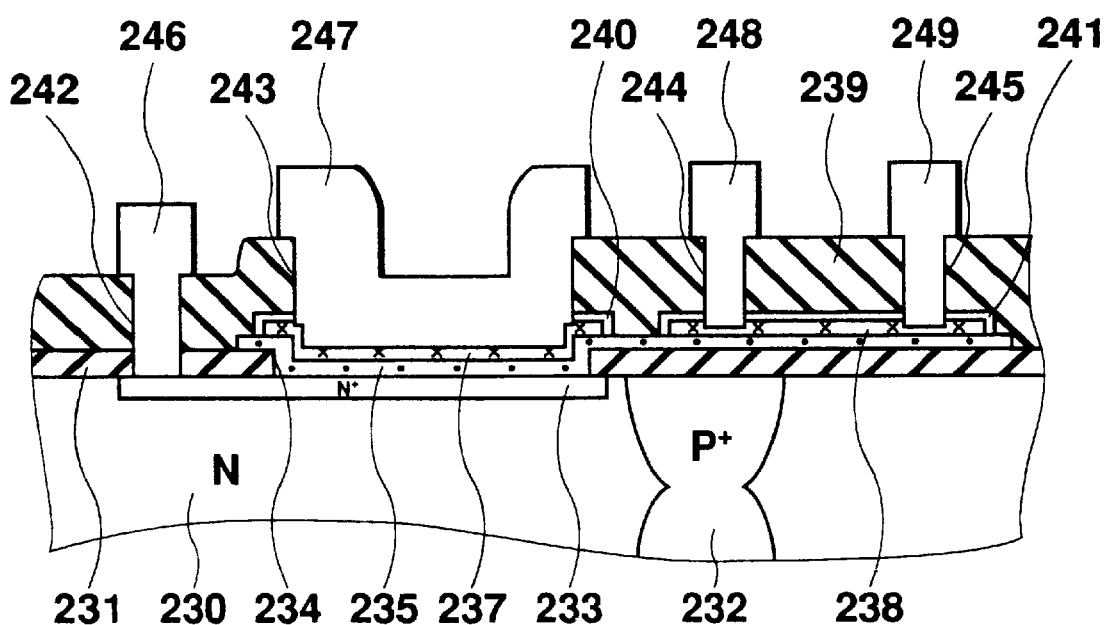

With this arrangement, the Si layer 236 protects the SiN layer 235, and also constitutes an electrode contacting an Al electrode 247 which is to be later formed thereon, or a second upper electrode, as shown in FIG. 23. If the first upper electrode is made of an a-Si originated Si film, defects will be less induced than a case where it is made of a p-Si originated Si film, thanks to the lower film formation temperature of an a-Si film.

In addition to the above, this embodiment also features use of a capacitor dielectric layer (the SiN layer 235) for a base of the resistance layer 238. As this is the same as the second embodiment and has been explained referring to FIG. 15, the explanation will not be repeated here.

Referring to FIG. 23, a third insulating layer 239 is formed, covering the entire surface of the subject. Note that oxide layers 240, 241 are formed on the surfaces of the resistance layer 238 and the first upper electrode 237, though these layers may be omitted.

Finally, a contact hole 242 is made such that the first lower electrode 232 is exposed. Similarly, an opening 243 and contact holes 244, 245 are made such that the first upper electrode 237, and a resistance layer 238 are exposed, respectively. Besides, a lower electrode 246, a second upper electrode 247, a first resistance element electrode 248, and a second resistance element electrode 249 are also formed.

It should be noted that the first upper electrode 237 has been made to have sufficient thickness so as not to be etched out when making the contact hole 243. That is, since the thicknesses of insulating layers to be etched to make the contact holes 242, 243 are different from each other, the first upper electrode 237 laying at the bottom of the contact hole 243 is subject to the risk of being etched when the respective insulating layers are being etched to form contact holes 242, 243 at the same time. Should the first upper electrode 237 be completely etched out, the voltage-resistance of the electrode would be deteriorated.

It should be also noted that, although the resistance layer 238 and the first upper electrode 237 have been formed simultaneously in the same process, as shown in FIGS. 21, 22, they may be formed at different times. Alternatively, the first upper electrode 237 may be omitted if protection of the dielectric layer 235 of the MIS capacitor is not considered.

It should be further noted that ion implantation to a Si film may be conducted before the Si film is formed, by using a silane gas having been beforehand doped with impurities, or after the Si film was formed. Alternatively, it may be conducted while diffusion regions are being formed.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method for manufacturing a semiconductor device carrying a capacitor and a resistance element being integrated on a single circuit substrate, comprising steps of:

forming a first insulating layer on either the substrate of the semiconductor device or a predetermined semiconductor layer;

forming an a-Si layer on a surface of the first insulating layer;

doping the a-Si layer with impurities;

heating the a-Si layer doped with impurities to diffuse the impurities to thereby form a first lower electrode;

forming a second insulating layer on the first lower electrode, having an opening where the first lower electrode is partially exposed;

forming a SiN dielectric layer in the opening and on a predetermined resistance layer formation region; and forming an a-Si layer covering the opening and the resistance layer formation region on the surface of the SiN dielectric layer to therewith constitute a first upper electrode and a resistance layer, respectively.

2. A method for manufacturing a semiconductor device according to claim 1, further comprising steps of:

forming a third insulating layer covering substantially an entire surface of the substrate after the a-Si layer is formed;

forming a number of openings at predetermined portions of the third insulating layer;

forming a second lower electrode contacting the first lower electrode of the capacitor at one of the number of openings;

forming a second upper electrode contacting the first upper electrode of the capacitor at another one of the number of openings; and forming a first resistance electrode and a second resistance electrode contacting the resistance layer of the resistance element at still another one of the number of openings.

3. A method for manufacturing a semiconductor device according to claim 1, further comprising a step of forming a SiN layer for being used as a base of the lower electrode before the lower electrode of the capacitor is formed.

4. A method for manufacturing a semiconductor device according to claim 1, wherein the a-Si layer is formed at approximately 520° C. to 580° C.

5. A method for manufacturing a semiconductor device carrying a capacitor and a resistance element being integrated on a single circuit substrate, comprising steps of:

doping with impurities either the substrate of the semiconductor device or a semiconductor layer at a predetermined region;

diffusing impurities in either the substrate of the semiconductor device or the semiconductor layer to form an impurity diffused region;

forming a first lower electrode using the impurity diffused region;

forming a first insulating layer on the first lower electrode having an opening where the first lower electrode is partially exposed;

forming a SiN dielectric layer covering the opening and a predetermined resistance layer formation region on the second insulating layer; and forming an a-Si layer covering the opening and the resistance layer formation region on the surface of the SiN dielectric layer to therewith constitute a first upper electrode and a resistance layer, respectively.

6. A method for manufacturing a semiconductor device according to claim 5, further comprising steps of:

forming a second insulating layer covering substantially an entire upper surface of the substrate after the a-Si layer is formed;

forming a number of openings at predetermined portions of the second insulating layer;

forming a second lower electrode contacting the first lower electrode of the capacitor at one of the number of openings;

forming a second upper electrode contacting the first upper electrode of the capacitor at another one of the number of openings; and forming a first resistance electrode and a second resistance electrode contacting the resistance layer of the resistance element at still another one of the number of openings.

7. A method for manufacturing a semiconductor device according to claim 5, wherein the a-Si layer is formed at approximately 520° C. to 580° C.

* * * * *